(12) United States Patent
Li et al.

(10) Patent No.: US 8,238,861 B2
(45) Date of Patent: Aug. 7, 2012

(54) AUTOMATIC GAIN CONTROL IN A WIRELESS COMMUNICATION NETWORK

(75) Inventors: Junyi Li, Chester, NJ (US); Ying Wang, Easton, PA (US); Thomas Richardson, South Orange, NJ (US); Aleksandar Jovicic, Piscataway, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 678 days.

(21) Appl. No.: 12/359,595

(22) Filed: Jan. 26, 2009

(65) Prior Publication Data

US 2010/0190459 A1    Jul. 29, 2010

(51) Int. Cl.
*H04B 7/00*    (2006.01)
(52) U.S. Cl. ............. 455/245.1; 455/241.1; 455/234.2; 455/251.1; 455/240.1; 455/249.1
(58) Field of Classification Search .... 455/234.1–253.2; 375/345
See application file for complete search history.

(56) References Cited

U.S. PATENT DOCUMENTS

| | | | | |
|---|---|---|---|---|
| 6,563,891 | B1 * | 5/2003 | Eriksson et al. | 375/345 |
| 6,748,200 | B1 * | 6/2004 | Webster et al. | 455/234.1 |
| 2009/0116430 | A1 * | 5/2009 | Bonta et al. | 370/329 |

FOREIGN PATENT DOCUMENTS

| | | |
|---|---|---|
| EP | 1300957 A1 | 4/2003 |
| WO | WO0031867 | 6/2000 |

OTHER PUBLICATIONS

International Search Report and Written Opinion—PCT/US2010/022143, International Search Authority—European Patent Office—Jul. 15, 2010.

\* cited by examiner

*Primary Examiner* — Matthew Anderson
*Assistant Examiner* — Ganiyu A Hanidu
(74) *Attorney, Agent, or Firm* — James K. O'Hare

(57) ABSTRACT

Techniques for performing automatic gain control (AGC) at a terminal in a wireless communication network are described. In an aspect, the terminal may use different receiver gain settings to receive different types of signals in different time intervals. The terminal may determine a receiver gain setting for each signal type and may use the receiver gain setting to receive signals of that signal type. In another aspect, the terminal may determine a receiver gain setting for a future time interval based on received power levels for peer terminals expected to transmit in that time interval. The terminal may measure received power levels of signals received from a plurality of terminals. The terminal may determine a set of terminals expected to transmit in the future time interval and may determine the receiver gain setting for the future time interval based on the measured received power levels for the set of terminals.

17 Claims, 9 Drawing Sheets

US 8,238,861 B2

AUTOMATIC GAIN CONTROL IN A WIRELESS COMMUNICATION NETWORK

BACKGROUND

I. Field

The present disclosure relates generally to communication, and more specifically to techniques for performing automatic gain control (AGC) at a terminal in a wireless communication network.

II. Background

Wireless communication networks are widely deployed to provide various communication services such as voice, video, packet data, messaging, broadcast, etc. These wireless networks may be capable of supporting communication for multiple users by sharing the available network resources. Examples of such wireless networks include wireless wide area networks (WWANs), wireless metropolitan area networks (WMANs), and wireless local area networks (WLANs).

In a wireless communication network, a terminal may receive signals from transmitters, which may be base stations and/or other terminals. The transmitters may transmit their signals at the same or different power levels. Furthermore, the transmitters may be located at different distances to the terminal and may thus have different pathloss to the terminal. The terminal may receive the signals from different transmitters at different received power levels. The terminal may perform AGC and adjust the gain of its receiver so that (i) strong signals are attenuated to avoid clipping an analog-to-digital converter (ADC) at the terminal and (ii) weak signals are amplified to occupy the full ADC range. By using the proper receiver gain, clipping of the ADC and degradation due to ADC clipping may both be avoided. It is thus desirable to effectively perform AGC at the terminal.

SUMMARY

Techniques for performing AGC at a terminal in a wireless communication network (e.g., a peer-to-peer network) are described herein. In an aspect, a terminal may use different receiver gain settings to receive different types of signals in different time intervals or frames. A receiver gain setting is an initial receiver gain used by the terminal, which may vary this initial receiver gain to obtain a desired signal level. In one design, the terminal may determine a first receiver gain setting for a first signal type, e.g., peer discovery signals. The terminal may use the first receiver gain setting to receive signals of the first signal type in a first time interval, e.g., a peer discovery frame. The terminal may determine a second receiver gain setting for a second signal type, e.g., paging signals. The terminal may use the second receiver gain setting to receive signals of the second signal type in a second time interval, e.g., a paging frame. The terminal may determine the first and second receiver gain settings based on characteristics of the first and second signal types, as described below.

In another aspect, a terminal may determine a receiver gain setting for a future time interval based on received power levels of peer terminals expected to transmit in that time interval. In one design, the terminal may receive signals (e.g., peer discovery signals) from a plurality of terminals in at least one frame. Each frame may comprise multiple resource blocks in multiple time intervals. Each terminal may transmit on different resource blocks in different frames and may select the different resource blocks based on a hopping function or pattern. The terminal may measure the received power levels of the signals received from the plurality of terminals. The terminal may determine a set of terminals expected to transmit in a future time interval from among the plurality of terminals based on the hopping function and information on current time. The terminal may determine a predicted received power level for the set of terminals in the future time interval based on the measured received power levels for the set of terminals. The terminal may determine a receiver gain setting for the future time interval based on the predicted received power level and a target power level. The terminal may use the receiver gain setting to receive signals from the set of terminals in the future time interval.

Various aspects and features of the disclosure are described in further detail below.

DETAILED DESCRIPTION

The techniques described herein may be used for various wireless communication networks such as WWANs, WMANs, WLANs, etc. The terms "network" and "system" are often used interchangeably. A WWAN may be a Code Division Multiple Access (CDMA) network, a Time Division Multiple Access (TDMA) network, a Frequency Division Multiple Access (FDMA) network, an Orthogonal FDMA (OFDMA) network, a Single-Carrier FDMA (SC-FDMA) network, etc. A CDMA network may implement a radio technology such as Universal Terrestrial Radio Access (UTRA), cdma2000, etc. A TDMA network may implement a radio technology such as Global System for Mobile Communications (GSM). An OFDMA network may implement a radio technology such as Evolved UTRA (E-UTRA), Ultra Mobile Broadband (UMB), Flash-OFDM®, etc. Long Term Evolution (LTE) is an upcoming release of "3rd Generation Partnership Project" (3GPP) that uses E-UTRA, which employs OFDMA on the downlink and SC-FDMA on the uplink. A WLAN may implement one or more standards in the IEEE 802.11 family of standards (which is also referred to as Wi-Fi), Hiperlan, etc. A WMAN may implement one or more standards in the IEEE 802.16 family of standards (which is also referred to as WiMAX). The techniques described herein may be used for the wireless networks and radio technologies mentioned above as well as other wireless networks and radio technologies.

Figure 1:
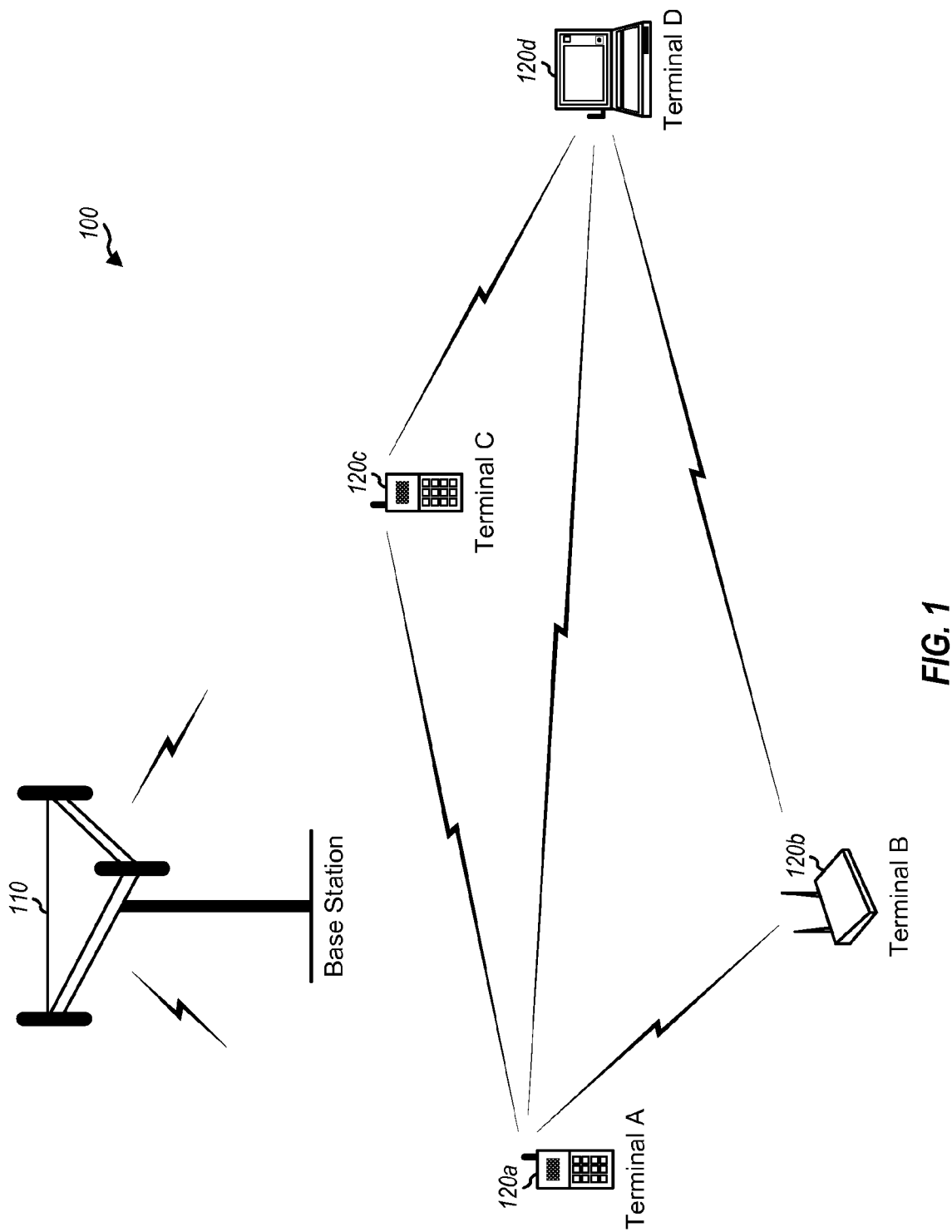
FIG. 1 shows a wireless communication network.

FIG. 1 shows a wireless communication network 100, which may include a number of base stations and a number of terminals. For simplicity, only one base station 110 and four terminals 120a, 120b, 120c and 120d are shown in FIG. 1. A base station may be a fixed station that communicates with the terminals and may also be referred to as an access point, a Node B, an evolved Node B (eNB), etc. Terminals 120 may be dispersed throughout the network, and each terminal may be stationary or mobile. A terminal may also be referred to as an access terminal, a mobile station, a user equipment (UE), a subscriber unit, a station, etc. A terminal may be a cellular phone, a personal digital assistant (PDA), a wireless modem, a wireless communication device, a handheld device, a laptop computer, a cordless phone, a wireless local loop (WLL) station, etc. A terminal may communicate with a base station or may receive information (e.g., timing information) from the base station. Alternatively or additionally, a terminal may communicate peer-to-peer with other terminals.

Figure 2:
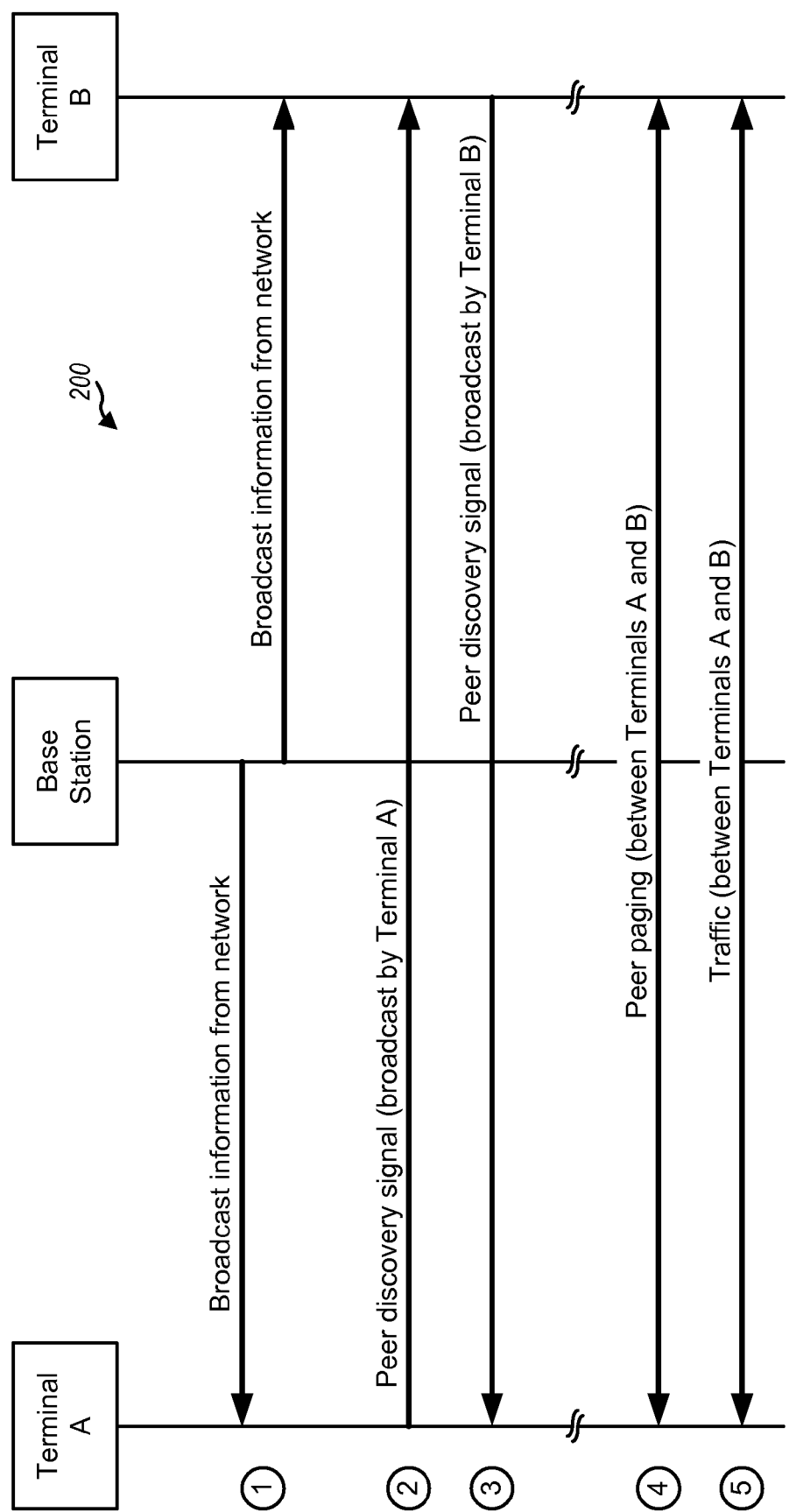
FIG. 2 shows an example message flow for peer-to-peer communication.

FIG. 2 shows a design of a message flow 200 that may be used for peer-to-peer communication between two terminals A and B in wireless network 100. Initially (e.g., at power up), terminals A and B may each receive broadcast information from base station 110 (step 1). Each terminal may obtain timing and possibly other information from the broadcast information. Terminal A may periodically broadcast a peer discovery signal to allow other terminals within the vicinity to detect terminal A (step 2). Similarly, terminal B may periodically broadcast a peer discovery signal to allow other terminals within the vicinity to detect terminal B (step 3). Terminals A and B may detect the presence of one another via the peer discovery signals. Thereafter, terminals A and B may page one another whenever there is data to send (step 4). A connection may then be established, and terminals A and B may exchange signaling and traffic data via the connection (step 5).

FIG. 2 shows an exemplary message flow that may be used for peer-to-peer communication. In general, a message flow for peer-to-peer communication may include any number of messages and any type of message.

Figure 3:
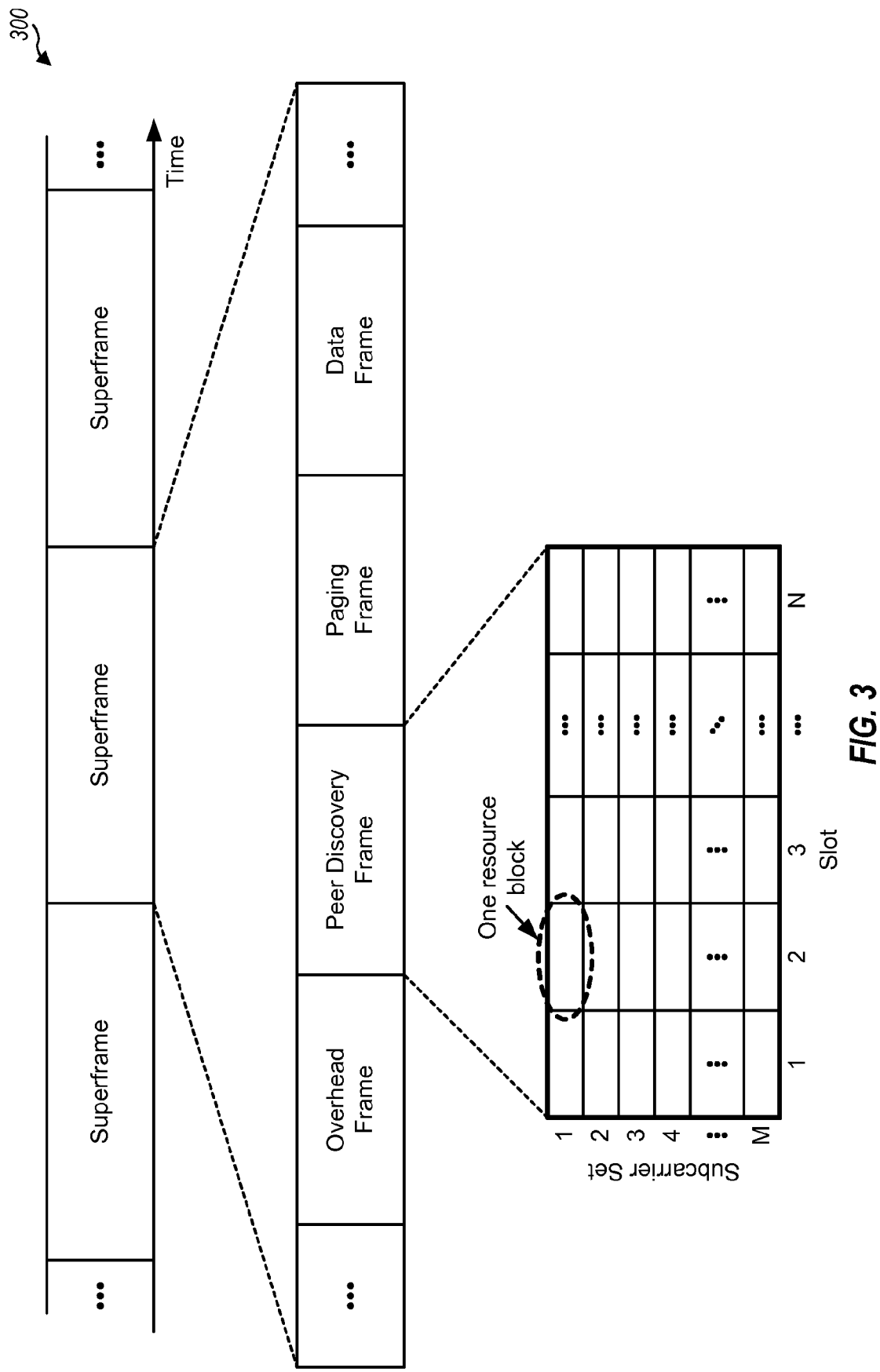
FIG. 3 shows an example transmission structure.

FIG. 3 shows a design of a transmission structure 300 that may be used for wireless network 100. The transmission timeline may be partitioned into units of superframes. Each superframe may cover a fixed or variable time duration and may be partitioned into a number of frames. In the design shown in FIG. 3, different types of signals or information may be sent in different frames. Some frames may be used to receive signals from base stations and may be referred to as overhead frames. Some frames may be used to send peer discovery signals and may be referred to as peer discovery frames. Some frames may be used to send paging signals and may be referred to as paging frames. Many or most frames may be used to send data and may be referred to as data frames. Other types of frames may also be defined. The different types of frames may have the same or different time durations.

In general, the frames of each type may be spaced apart by any suitable duration. The interval between overhead frames may be dependent on the radio technology used by the base stations, which may be 25 milli-seconds (ms) for UMB or some other duration for other radio technologies. The interval between peer discovery frames and the interval between paging frames may each be any suitable duration. The overhead frames, the peer discovery frames, and the paging frames may have the same or different periodicity. Each superframe may or may not include an overhead frame, may or may not include a peer discovery frame, and may or may not include a paging frame.

FIG. 3 also shows a design of a peer discovery frame. In this design, the peer discovery frame is partitioned into N slots with indices of 1 through N, where N may be any integer value. Each slot includes S symbol periods, where S may be any integer value. The system bandwidth may be partitioned into multiple (K) subcarriers with orthogonal frequency division multiplexing (OFDM) or single-carrier frequency division multiplexing (SC-FDM). M subcarrier sets with indices of 1 through M may be defined, where M≦K. Each subcarrier set may include one or more subcarriers. Resource blocks may be defined based on the available slots and subcarrier sets in the peer discovery frame. In the design shown in FIG. 3, a resource block covers one subcarrier set in one slot. Each resource block within a peer discovery frame may be uniquely identified by an index (m,n), which is composed of a subcarrier set index m and a slot index n. A resource block may be used by one terminal to send its peer discovery signal. A collision occurs when multiple terminals send their peer discovery signals on the same resource block.

A given terminal A may receive signals from one or more transmitters. Terminal A may perform AGC in order to obtain the desired input signal level for an ADC at terminal A.

Figure 4:
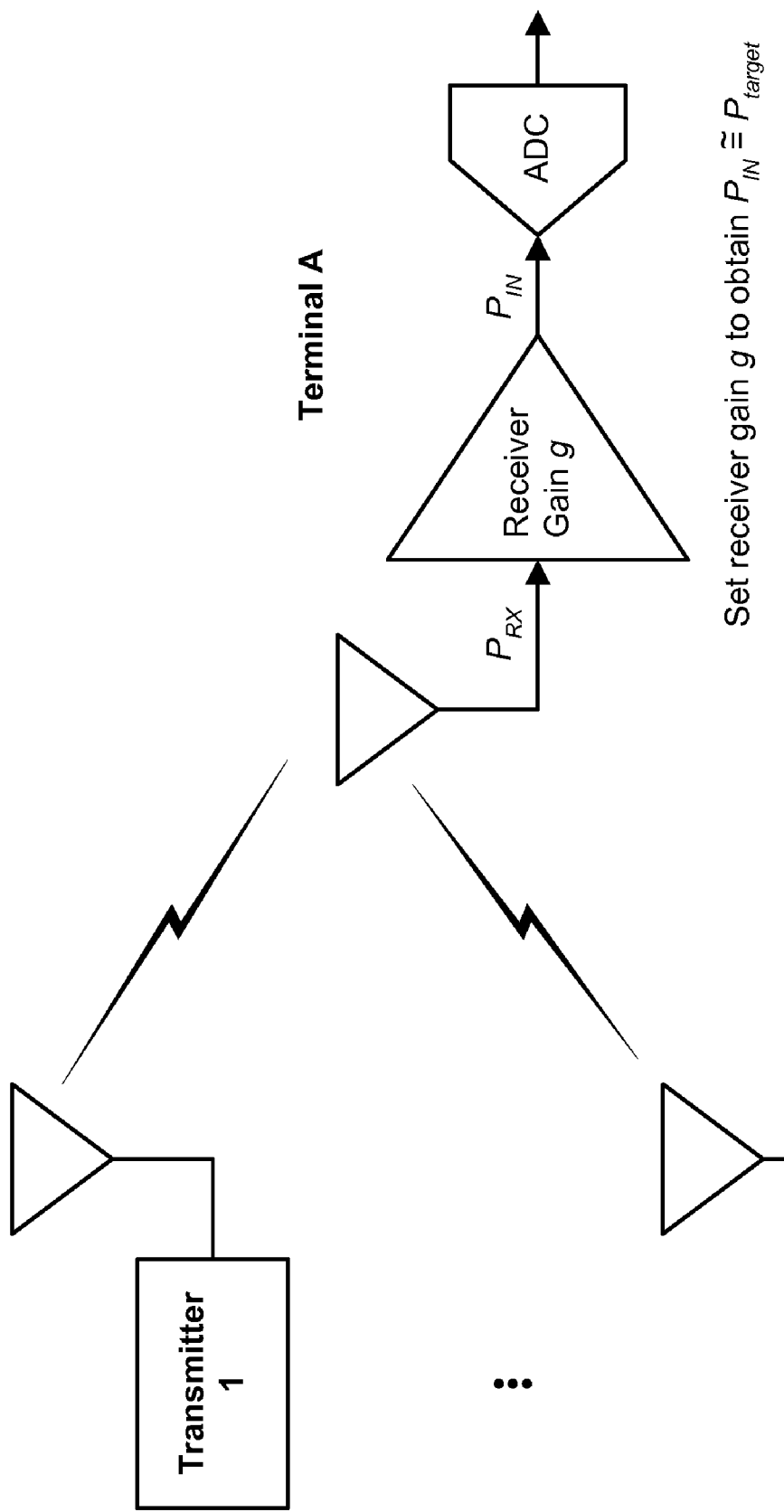
FIG. 4 shows transmission from multiple transmitters to a terminal.

FIG. 4 shows transmission from K transmitters 1 through K to terminal A, where K may be one or greater. Each transmitter may transmit a signal at a particular transmit power level via a wireless channel. Terminal A may receive the signal from each transmitter at a received power level that is determined by the transmit power level for the signal and the pathloss from that transmitter to terminal A. Terminal A may obtain a received signal comprising the signals from all K transmitters and having a received power level of $P_{RX}$. Terminal A may scale (e.g., amplify or attenuate) the received signal with a receiver gain of g and may obtain an ADC input signal having an input power level of $P_{IN}$. Terminal A may amplify the received signal if the receiver gain is greater than one or attenuate the received signal if the receiver gain is less than one.

Terminal A may perform AGC to obtain a target power level for the ADC input signal. For AGC, terminal A may (i) increase the receiver gain if the input power level is lower than the target power level or (ii) decrease the receiver gain if the input power level is higher than the target power level.

Terminal A may receive different types of signals from different transmitters. Each transmitter may be a base station or another terminal. Terminal A may receive signals of each type in frames used for that signal type.

Figure 5:
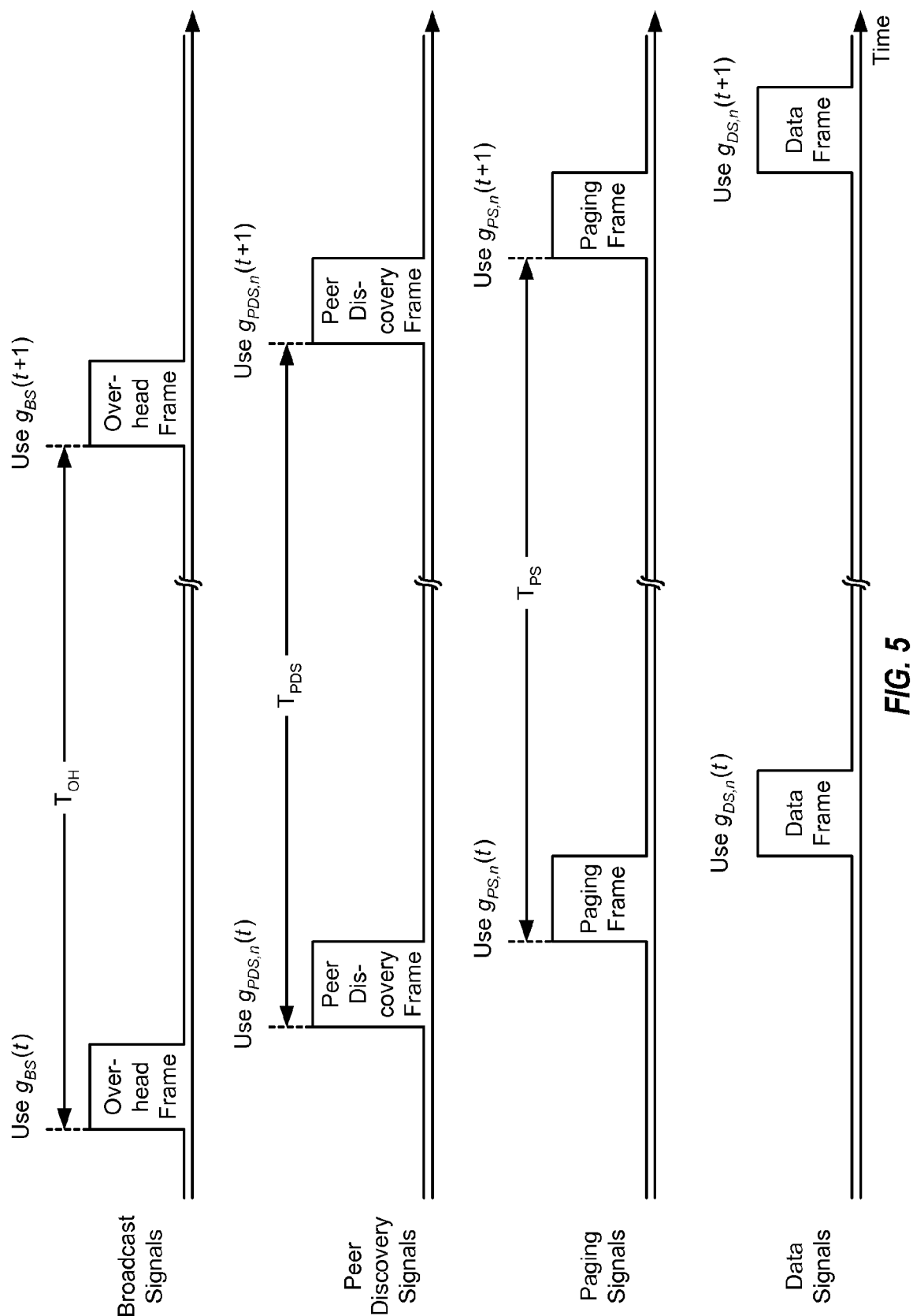
FIG. 5 shows signal reception for different types of signal.

FIG. 5 shows a design of signal reception by terminal A. Terminal A may receive broadcast signals from base stations in overhead frames, which may be spaced apart by an interval of $T_{OH}$ seconds. The broadcast signals may be beacon signals, synchronization signals, pilot signals, forward link signals carrying broadcast and control channels, etc. Terminal A may obtain timing and/or other information from the broadcast signals.

Terminal A may receive peer discovery signals from other terminals in peer discovery frames, which may be spaced apart by an interval of $T_{PDS}$ seconds. Each terminal may transmit its peer discovery signal on different resource blocks in different peer discovery frames and may select these resource blocks based on a hopping function that may be known to all terminals. Terminal A may be able to ascertain the resource blocks used by peer terminals already discovered by terminal A and may detect for the peer discovery signals from these terminals in these resource blocks. Terminal A may also detect for peer discovery signals from new terminals in slots not used by terminal A to transmit its peer discovery signal.

Terminal A may receive paging signals from other terminals in paging frames, which may be spaced apart by an interval of $T_{PS}$ seconds. Terminal A may transmit a paging signal to another terminal that terminal A has already discovered whenever terminal A wants to communicate with that terminal. Similarly, other terminals may transmit paging signals to terminal A whenever they want to communicate with terminal A. Terminal A may detect for paging signals from other terminals in each paging frame.

Terminal A may receive data signals from other terminals in data frames, which may be spaced apart by any amount. Terminal A may receive data signals from other terminals that have paged terminal A and may thus know the senders of the data signals. Data transmission may also be scheduled, so that terminal A knows when to receive the data signals.

As shown in FIG. 5, terminal A may receive different types of signals in different frames. Terminal A may know when to expect signals of each type based on the transmission structure. For each signal type, terminal A may also know the actual and/or likely transmitters of signals that terminal A might receive. Terminal A may perform AGC based on this knowledge to improve reception performance.

In an aspect, terminal A may use different receiver gain settings for different types of signals received in different frames. A receiver gain setting may also be referred to as a receiver gain mode, an AGC gain setting, an AGC mode, etc. For each signal type, terminal A may measure the received power levels of signals of that type in one or more prior frames. Terminal A may then determine one or more receiver gain settings to use to receive signals of that type in the next frame based on the measured received power levels in the prior frame(s). If the receiver gain setting(s) are properly selected, then terminal A may only need to adjust its receiver gain by a small amount instead of a large amount, which may improve performance. Terminal A may determine one or more receiver gain settings for each signal type based on the characteristics of the signals of that type, as described below.

For broadcast signals, terminal A may expect to receive broadcast signals from the same set of base stations in each overhead frame, unless terminal A has moved by a large amount. Terminal A may measure the received power level of the broadcast signals in each overhead frame. In one design, terminal A may determine a receiver gain setting for the next overhead frame based on the received power level of the most recent overhead frame, as follows:

$$g_{BS}(t+1) = \sqrt{\frac{P_{BS\_target}}{P_{BS\_RX}(t)}}, \quad \text{Eq (1)}$$

where $P_{BS\_RX}(t)$ is the received power level for broadcast signals in overhead frame t, $P_{BS\_target}$ is a target power level for broadcast signals, and
$g_{BS}(t+t)$ is a receiver gain setting for broadcast signals in overhead frame t+1.

Power and gain are given in linear units in equation (1) and in most of the description below.

In the design shown in equation (1), the receiver gain setting is selected such that the received power level for the broadcast signals, after applying the receiver gain, is close to a target power level for the broadcast signals. In another design, terminal A may measure the received power level for each overhead frame and may average the received power levels across different overhead frames to obtain a filtered received power level $\tilde{P}_{BS\_RX}(t)$. The averaging may be based on a finite impulse response (FIR) filter, an infinite impulse response (IIR) filter, etc. Terminal A may then determine a receiver gain setting for the next overhead frame based on the filtered received power level (instead of the measured received power level) for the most recent overhead frame.

In general, terminal A may determine the receiver gain setting for the next overhead frame based on received power levels for one or more prior overhead frames. If terminal A has not moved or has moved by a small amount between overhead frames, then the received power level for the next overhead frame may be accurately predicted based on the received power levels for the prior overhead frame(s). Terminal A may then apply an appropriate receiver gain setting for the next overhead frame based on the predicted received power level.

For peer discovery signals, terminal A has knowledge of which peer terminals have been discovered by terminal A. Terminal A may determine the received power level of the peer discovery signal from each peer terminal in one or more prior peer discovery frames. Terminal A may determine the slots in which the peer terminals will transmit their peer discovery signals in the next peer discovery frame based on a hopping function and knowledge of frame timing. Terminal A may then predict the received power level for each slot in the next peer discovery frame based on (i) knowledge of which peer terminals will likely transmit in the slot and (ii) the received power level for each peer terminal that will likely transmit in the slot. Terminal A may then determine a receiver gain setting for each slot in the next peer discovery frame based on the predicted receive power for the slot, as described below.

For paging signals, terminal A has knowledge of which peer terminals can page terminal A but may not know which of these peer terminals (if any) will actually page terminal A in the next paging frame. In one design, terminal A may use a predetermined receiver gain setting of $g_{PS}$, which may be a maximum receiver gain setting, a minimum receiver gain setting, or some other receiver gain setting. Each peer terminal may know (i) the receiver gain setting used by terminal A and (ii) the pathloss from that peer terminal to terminal A. The pathloss may be estimated based on the peer discovery signal received from terminal A. Each peer terminal may set its transmit power for a paging signal, as follows:

$$P_{PS\_TX,k} = \frac{PL_k * P_{PS\_target}}{g_{PS}^2}, \quad \text{Eq (2)}$$

where $P_{PS\_target}$ is a target power level for a paging signal,
$PL_k$ is the pathloss from peer terminal k to terminal A,
$g_{PS}$ is the receiver gain setting used by terminal A for paging signals, and
$P_{PS\_TX,k}$ is the transmit power level for a paging signal from peer terminal k.

In the design shown in equation (2), the transmit power level is selected such that the received power level of the paging signal from peer terminal k, after scaling by the receiver gain of $g_{PS}$, is close to the target power level for the paging signal at terminal A.

Terminal A may use a single receiver gain setting to receive paging signals from all peer terminals. If terminal A uses the maximum receiver gain setting, then a nearby terminal may need to transmit at a very low power level in order to avoid clipping the ADC at terminal A. The nearby terminal may not be able to transmit at such a low power level. Conversely, if terminal A uses the minimum receiver gain setting, then a distant terminal may need to transmit at a very high power level in order to be received at a sufficient power level by terminal A. The distant terminal may not be able to transmit at such a high power level.

In another design, terminal A may use different receiver gain settings in different paging frames to receive paging signals from peer terminals. The receiver gain settings for different paging frames may be selected based on a pattern that may be known by the peer terminals. The pattern may include multiple receiver gain settings, and terminal A may cycle through the pattern and use a different receiver gain setting for each paging frame. For example, the pattern may include a high receiver gain setting, a mid receiver gain setting, and a low receiver gain setting. Terminal A may use the high receiver gain setting in paging frame t, then the mid receiver gain setting in paging frame t+1, then the low receiver gain setting in paging frame t+2, then back to the high receiver gain setting in paging frame t+3, etc. A peer terminal may select an appropriate paging frame to send a paging signal to terminal A based on the known pattern and the pathloss from that terminal to terminal A. The peer terminal may also determine the transmit power level for the paging signal based on the receiver gain setting for the selected paging frame, the pathloss, and the target power level, as shown in equation (2).

For data signals, terminal A may have knowledge of which peer terminal will transmit a data signal to terminal A in the next data frame. Terminal A may then select a receiver gain setting such that the data signal from the peer terminal will be received at or near a target power level for the data signal at terminal A.

Referring to FIG. 5, terminal A may use receiver gain setting $g_{BS}(t)$ for overhead frame t, receiver gain setting $g_{PDS,n}(t)$ for peer discovery frame t, receiver gain setting $g_{PS,n}(t)$ for paging frame t, and receiver gain setting $g_{DS,n}(t)$ for data frame t. For simplicity, the same frame index t is used for all signal types. For each signal type, frame index t may be incremented whenever a frame for that signal type appears. The frame indices for different signal types may be updated at the same rate or different rates depending on how often the frames for these signal types appear. The receiver gain settings for different signal types may be determined as described above.

For each type of signal, terminal A may use a receiver gain setting determined for that signal type as an initial receiver gain at the start of a frame for the signal type. Terminal A may perform AGC and (i) increase the receiver gain if the input power level at the ADC is lower than the target power level or (ii) decrease the receiver gain if the input power level is higher than the target power level. Terminal A may measure the received power level for the signal type and may use the measured received power level to determine the receiver gain setting for the next frame, as described above. Terminal A may also record the final receiver gain for the current frame and may use this receiver gain as the receiver gain setting for the next frame.

In another aspect, terminal A may determine a receiver gain setting for each slot in a peer discovery frame based on received power levels of peer terminals expected to transmit in that slot. Each terminal may transmit its peer discovery signal on different resource blocks in different peer discovery frames in order to reduce or randomize collisions with peer discovery signals from other terminals. Each terminal may select the different resource blocks based on the known frame timing, a hopping function, and one or more parameter values for the hopping function. All terminals may have knowledge of the frame timing (which may be obtained from base station 110 or some other common time source) as well as the hopping function (which may be known a priori or signaled to the terminals). Terminal A may be able to determine the parameter value(s) used by a given peer terminal upon detecting a peer discovery signal from that peer terminal. Terminal A may then be able to determine the resource blocks used by each discovered peer terminal based on the known frame timing, the hopping function, and the parameter value(s) for that peer terminal.

In one design, each terminal may select a resource block in each peer discovery frame as follows:

$$m_{t+1} = [(m_t + \Delta m) \bmod M] + 1, \qquad \text{Eq (3a)}$$

$$n_{t+1} = [(n_t + \Delta n) \bmod N] + 1, \qquad \text{Eq (3b)}$$

$$\Delta m = f_m(m_0, n_0, t), \text{ and} \qquad \text{Eq (3c)}$$

$$\Delta n = f_n(m_0, n_0, t), \qquad \text{Eq (3d)}$$

where $m_0$ is an initial subcarrier set selected for the first peer discovery frame t=0, $n_0$ is an initial slot selected for the first peer discovery frame, $\Delta m$ is a subcarrier offset or a change in subcarrier set from one frame to the next, $\Delta n$ is a slot offset or a change in slot from one frame to the next, $f_m(x)$ and $f_n(x)$ are functions of one or more parameters denoted as x, $m_t$ is a subcarrier set to use for the peer discovery signal in frame t, $n_t$ is a slot to use for the peer discovery signal in frame t, and "mod" denotes a modulo operation.

Addition and modulo operations in equations (3a) and (3b) may be performed over Galois fields of sizes M and N, respectively. The "+1" in equations (3a) and (3b) is due to the use of indices that start from 1 instead of 0, as shown in FIG. 3.

A resource unit $(m_t, n_t)$ may be used for a peer discovery signal in peer discovery frame t. A terminal may select an initial subcarrier set $m_0$ and an initial slot $n_0$ for the first peer discovery frame t=0 in various manners. In one design, the terminal may pseudo-randomly select an initial resource block $(m_0, n_0)$. In another design, the terminal may measure the received power of each resource block in one or more peer discovery frames and may select the resource block with the lowest received power as the initial resource block $(m_0, n_0)$. In any case, indices $m_0$ and $n_0$ may be considered as parameter values for the hopping function defined by equation set (3).

In the design shown in equation set (3), the subcarrier set $m_{t+1}$ to use in each subsequent frame may be computed by an offset of $\Delta m$ from the subcarrier set $m_t$ used in the preceding frame. The slot $n_{t+1}$ to use in each subsequent frame may be computed by an offset of $\Delta n$ from the slot $n_t$ used in the preceding frame. The selected subcarrier sets thus shift by a constant amount of $\Delta m$ across frames, and the selected slots shift by a constant amount of $\Delta n$ across frames. $\Delta m$ and M may be relatively prime so that all M subcarrier sets 1 through M are selected in M consecutive frames. $\Delta m$ may also be equal to zero to disable frequency hopping. $\Delta n$ and N may be relatively prime so that all N different slots 1 through N are selected in N consecutive frames.

In one design, terminal A may measure the received power levels of peer discovery signals from peer terminals. Terminal A may then determine a suitable receiver gain setting for each slot in each peer discovery frame based on the measured received power levels, as illustrated by the example below.

Figure 6:
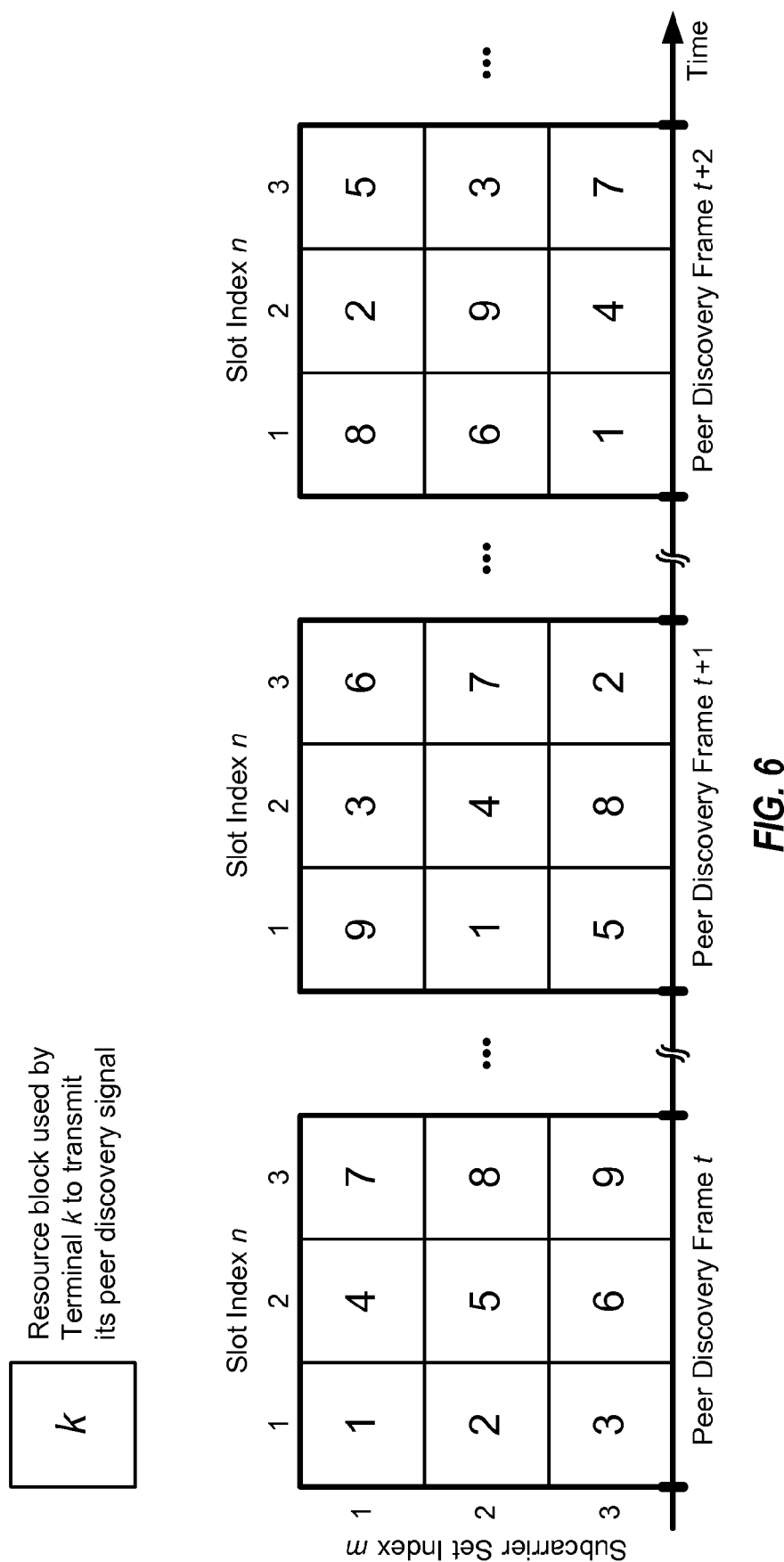
FIG. 6 shows transmission of peer discovery signals with time hopping.

FIG. 6 shows example transmission of peer discovery signals with time and frequency hopping. In this example, each peer discovery frame includes nine resource blocks formed by three subcarrier sets 1, 2 and 3 in three slots 1, 2 and 3. Nine terminals 1 through 9 may transmit their peer discovery signals on the nine resource blocks in each peer discovery frame. In FIG. 6, each resource block (m,n) has a label k that indicates the terminal using that resource block for the peer discovery signal, where m ∈ {1, 2, 3}, n ∈ {1, 2, 3} and k ∈ {1, ..., 9}. For example, terminal 5 uses block (2,2) in peer discovery frame t, resource block (3,1) in peer discovery frame t+1, and resource block (1,3) in peer discovery frame t+2.

Terminal A may measure the received power levels of the peer discovery signals from terminals 1 through 9 in peer discovery frame t. Terminal A may be able to ascertain the resource block used by each peer terminal in peer discovery frame t+1 based on the known hopping function, the known frame timing, and the resource block(s) used by that peer terminal in one or more prior peer discovery frames. Terminal A may then compute a predicted received power level for each slot in peer discovery frame t+1 based on the measured received power levels for terminals 1 through 9, as follows:

$$P_{PRE,1}(t+1) = P_{RX,1}(t) + P_{RX,5}(t) + P_{RX,9}(t), \qquad \text{Eq (4a)}$$

$$P_{PRE,2}(t+1) = P_{RX,3}(t) + P_{RX,4}(t) + P_{RX,8}(t), \text{ and} \qquad \text{Eq (4b)}$$

$$P_{PRE,3}(t+1) = P_{RX,2}(t) + P_{RX,6}(t) + P_{RX,7}(t), \qquad \text{Eq (4c)}$$

where $P_{RX,k}(t)$ is the measured received power level of the peer discovery signal from peer terminal k in peer discovery frame t, and
$P_{PRE,n}(t+1)$ is the predicted received power level for slot n in peer discovery frame t+1.

In the design shown in equation set (4), terminal A may assume that each peer terminal will be received at the same power level in the next peer discovery frame t+1 as in the prior peer discovery frame t. The predicted received power level for each slot in peer discovery frame t+1 may then be computed as the sum of the received power levels of the peer discovery signals of all peer terminals expected to be received in that slot.

In another design, terminal A may measure the received power level for each peer terminal k in each peer discovery frame and may average the measured received power levels across different peer discovery frames to obtain a filtered received power level for peer terminal k. Terminal A may then compute the predicted received power level for each slot based on the filtered received power levels for peer terminals expected to be received in that slot.

In general, terminal A may compute the predicted received power level for each slot as follows:

$$P_{PRE,n}(t+1) = \sum_{k \in S_n(t+1)} P_{RX,k}(t), \qquad \text{Eq (5)}$$

where $S_n(t+1)$ is a set of terminals expected to be received in slot n of peer discovery frame t+1.

Terminal A may determine a receiver gain setting for each slot in peer discovery frame t+1, as follows:

$$g_{PDS,n}(t+1) = \sqrt{\frac{P_{PDS\_target}}{P_{PRE,n}(t+1)}}, \qquad \text{Eq (6)}$$

where $P_{PDS\_target}$ is a target power level for peer discovery signals, and
$g_{PDS,n}(t+1)$ is a receiver gain setting for peer discovery signals for slot n in peer discovery frame t+1.

Terminal A may obtain one receiver gain setting for each slot in peer discovery frame t+1. The receiver gain setting for each slot may be dependent on the received power levels for peer terminals expected to be received in that slot, e.g., as shown in equation (5). The receiver gain setting for each slot may be such that the total received power level for that slot, after scaling by the receiver gain, is at or near the target power level. The receiver gain setting may be an initial receiver gain and may be adjusted based on the actual received power levels to obtain a desired input signal level for the ADC at terminal A.

Terminal A may obtain N receiver gain settings for the N slots in peer discovery frame t+1. These receiver gain settings may be similar or may vary over a wide range. Terminal A may use the receiver gain setting for each slot to receive peer discovery signals in that slot. Improved detection performance may be obtained by using a receiver gain setting that can provide the desired ADC input signal level while avoiding ADC clipping in each slot.

Terminal A may update the receiver gain settings for each peer discovery frame. Terminal A may measure the received power levels of the peer discovery signals received in each slot in peer discovery frame t+1. For the example shown in FIG. 6, terminal A may determine the receiver gain setting for each slot in the following peer discovery frame t+2 as follows:

$$g_{PDS,1}(t+2) = \sqrt{\frac{P_{PDS\_target}}{P_{RX,1}(t+1) + P_{RX,6}(t+1) + P_{RX,8}(t+1)}}, \qquad \text{Eq (7a)}$$

$$g_{PDS,2}(t+2) = \sqrt{\frac{P_{PDS\_target}}{P_{RX,2}(t+1) + P_{RX,4}(t+1) + P_{RX,9}(t+1)}}, \text{ and} \qquad \text{Eq (6b)}$$

$$g_{PDS,3}(t+2) = \sqrt{\frac{P_{PDS\_target}}{P_{RX,3}(t+1) + P_{RX,5}(t+1) + P_{RX,7}(t+1)}}. \qquad \text{Eq (6c)}$$

In general, terminal A may measure the received power levels of the peer discovery signals from peer terminals in one or more peer discovery frames. Terminal A may ascertain the resource block used by each peer terminal throughput send the peer discovery signal on the future based on the known hopping function, the known frame timing, and one or more resource blocks on which the peer discovery signal from that peer terminal was detected. Terminal A may determine a predicted received power level for each slot in the future peer discovery frame based on the measured received power levels for all peer terminals expected to be received in that slot. Terminal A may then compute a receiver gain setting for each slot in the future peer discovery frame based on the predicted received power level for that slot and the target power level.

Figure 7:
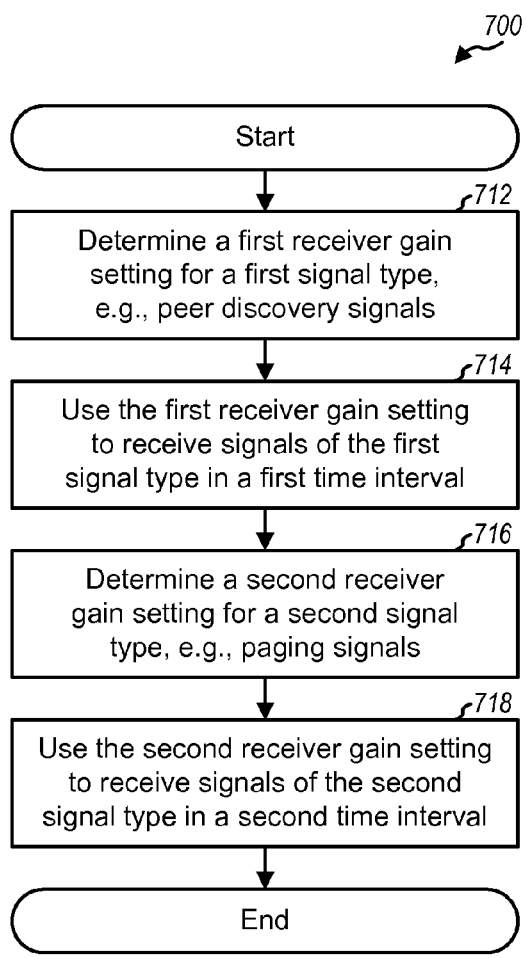
FIG. 7 shows a process for receiving signals of different types.

FIG. 7 shows a design of a process 700 for receiving signals of different types in a wireless communication network, e.g., a peer-to-peer network. Process 700 may be performed by a terminal (as described below) or some other entity. The terminal may determine a first receiver gain setting for a first signal type (block 712). The terminal may use the first receiver gain setting to receive signals of the first signal type in a first time interval (block 714). The terminal may determine a second receiver gain setting for a second signal type (block 716). The terminal may use the second receiver gain setting to receive signals of the second signal type in a second time interval (block 718). The first and second time intervals may correspond to different types of frames (e.g., as shown in FIGS. 3 and 5) or some other units of time.

In one design, the signals of the first signal type may comprise peer discovery signals, and the signals of the second signal type may comprise paging signals. In one design of block 712, the terminal may measure received power levels of the signals of the first signal type in at least one prior time interval. The terminal may then determine the first receiver gain setting based on the measured received power levels and a target power level for the signals of the first signal type. In one design of block 716, the terminal may select different receiver gain settings in different time intervals for the second signal type based on a predetermined pattern comprising multiple receiver gain settings. The terminal may also determine the first and second receiver gain settings in other manners. The terminal may also perform AGC for each signal type during its time interval. For example, the terminal may measure the total received power for the signals of the first signal type during the first time interval and may adjust the receiver gain during the first time interval based on the total received power. The terminal may detect for signals of the first signal type in the first time interval to discover peer terminals. The terminal may detect for signals of the second signal type from previously discovered terminals in the second time interval.

The terminal may determine the first time interval for the first signal type based on current time and a first periodic pattern for the first signal type. The terminal may determine the second time interval for the second signal type based on the current time and a second periodic pattern for the second signal type. The terminal may also determine the first and second time intervals based on a transmission or frame structure used by the network, e.g., as shown in FIG. 3.

The first and second signal types may also be for other types of signals. The terminal may also determine one or more additional receiver gain settings for one or more additional signal types. The terminal may use each additional receiver gain setting to receive signals of a corresponding signal type in another time interval. For example, the terminal may determine a third receiver gain setting for broadcast signals and may use the third receiver gain setting to receive broadcast signals from base stations in a third time interval. The terminal may obtain timing information from the broadcast signals and may determine the first and second time intervals for the first and second signal types based on the timing information.

Figure 8:
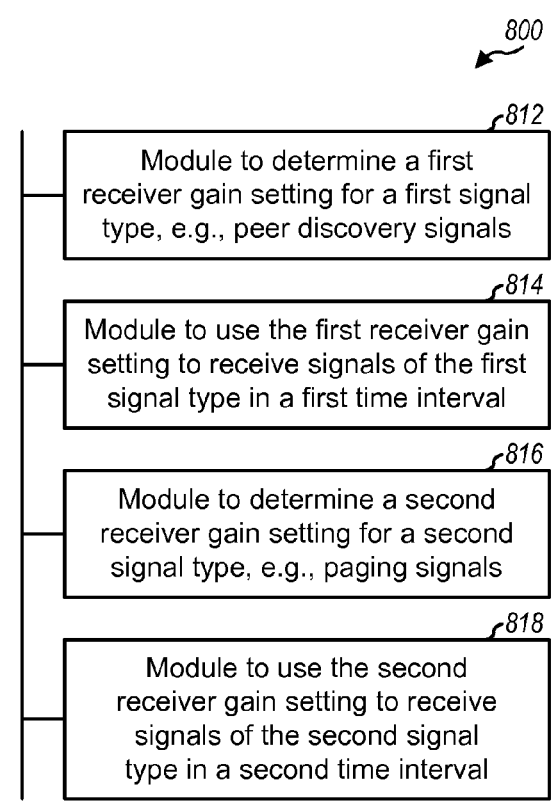
FIG. 8 shows an apparatus for receiving signals of different types.

FIG. 8 shows a design of an apparatus 800 for receiving signals of different types. Apparatus 800 includes a module 812 to determine a first receiver gain setting for a first signal type, a module 814 to use the first receiver gain setting to receive signals of the first signal type in a first time interval, a module 816 to determine a second receiver gain setting for a second signal type, and a module 818 to use the second receiver gain setting to receive signals of the second signal type in a second time interval.

Figures 9, 10:
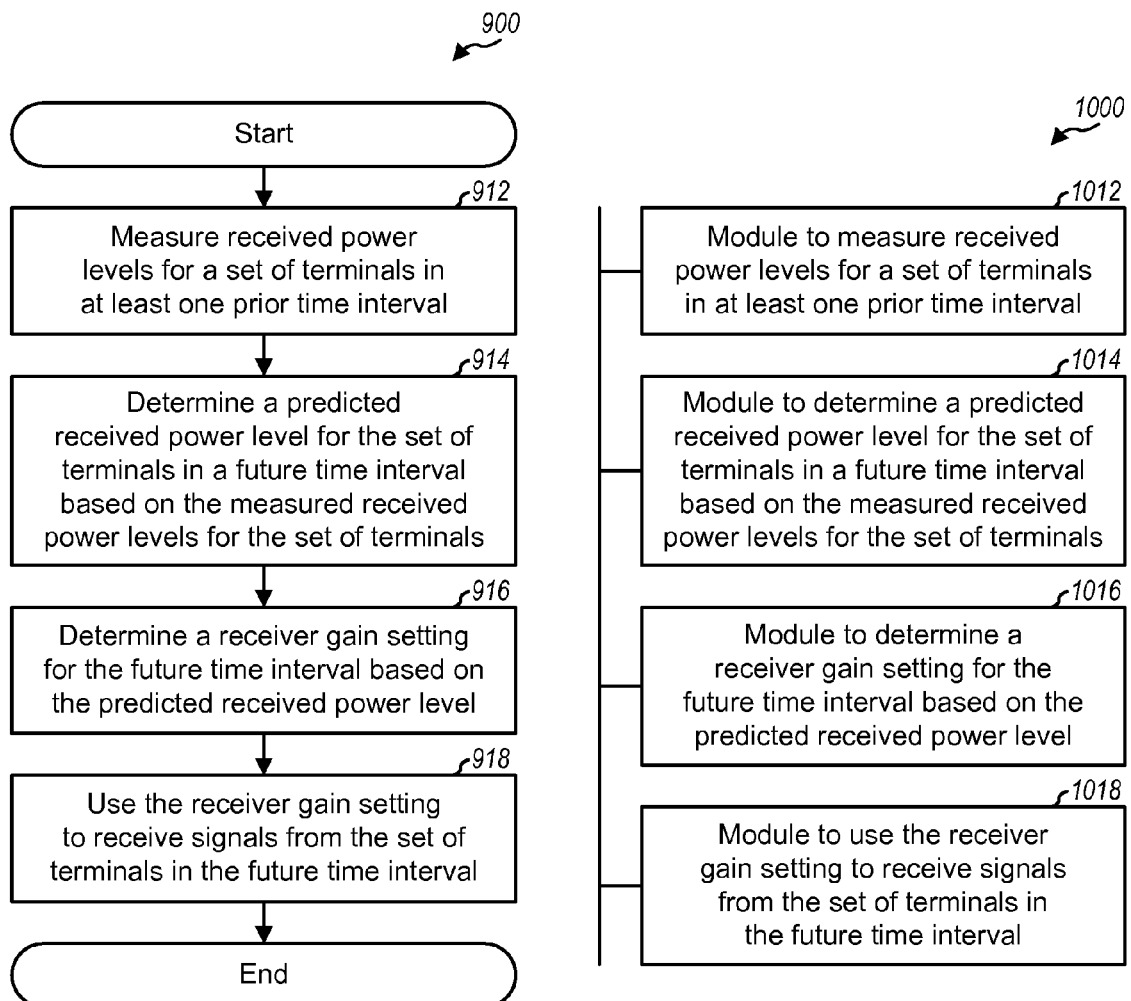
FIG. 9 shows a process for receiving peer discovery signals.
FIG. 10 shows an apparatus for receiving peer discovery signals.

FIG. 9 shows a design of a process 900 for receiving signals in a wireless communication network, e.g., a peer-to-peer network. Process 900 may be performed by a terminal (as described below) or some other entity. The terminal may measure received power levels for a set of terminals in at least one prior time interval (block 912). Each time interval may correspond to a slot described above or some other unit of time. The terminal may determine a predicted received power level for the set of terminals in a future time interval based on the measured received power levels for the set of terminals, e.g., as shown in equation (5) (block 914). The terminal may determine a receiver gain setting for the future time interval based on the predicted received power level and a target power level, e.g., as shown in equation (6) (block 916). The terminal may use the receiver gain setting to receive signals (e.g., peer discovery signals) from the set of terminals in the future time interval (block 918).

In one design, the terminal may receive signals from a plurality of terminals in at least one frame, with each frame comprising multiple time intervals or slots. Each terminal may transmit in different time intervals in different frames and may select the different time intervals based on a hopping function. The hopping function may define a periodic pattern of signal occurrences. In another design, the terminal may receive signals from a plurality of terminals in at least one frame, with each frame comprising a plurality of resource blocks formed with multiple subcarrier sets in multiple time intervals or slots. Each terminal may transmit on different resource blocks in different frames and may select the different resource blocks based on a hopping function. For both designs, the terminal may measure the received power levels of the signals received from the plurality of terminals. The terminal may determine the set of terminals from among the plurality of terminals based on the hopping function and information on current time. The terminal may expect to receive signals from the set of terminals in the future time interval.

For example, the set of terminals may comprise terminals 3, 4 and 8 in the example shown in FIG. 6. The terminal may measure the received power levels for terminals 3, 4 and 8 in prior time intervals corresponding to slots 1, 2 and 3 in frame t. The terminal may determine the predicted received power level for terminals 3, 4 and 8 in the future time interval corresponding to slot 2 in frame t+1 based on the measured received power levels for these terminals. The terminal may then determine a receiver gain setting for the future time interval based on the predicted received power level and the target power level.

In one design, the terminal may determine the predicted received power level for the set of terminals based on the most recent measured received power level for each terminal in the set. In another design, the terminal may filter the measured received power level for each terminal across multiple time intervals to obtain a filtered received power level for that terminal. The terminal may then determine the predicted received power level for the set of terminals based on filtered received power levels.

In one design of block 918, the terminal may set a receiver gain based on (e.g., equal to) the receiver gain setting. The terminal may scale (e.g., amplify or attenuate) a received signal in accordance with the receiver gain to obtain a scaled signal. In one design, the terminal may perform AGC and may adjust the receiver gain to maintain the scaled signal within a predetermined range. In another design, the terminal does not perform AGC and uses the receiver gain setting for the entire future time interval. In one design, the terminal may perform AGC during the future time interval. For example, the terminal may measure the total received power for the set of terminals during the future time interval and may adjust the receiver gain during the future time interval based on the total received power.

FIG. 10 shows a design of an apparatus 1000 for receiving signals. Apparatus 1000 includes a module 1012 to measure received power levels for a set of terminals in at least one prior time interval, a module 1014 to determine a predicted received power level for the set of terminals in a future time interval based on the measured received power levels for the set of terminals, a module 1016 to determine a receiver gain setting for the future time interval based on the predicted received power level and a target power level, and a module 1018 to use the receiver gain setting to receive signals (e.g., peer discovery signals) from the set of terminals in the future time interval.

The modules in FIGS. 8 and 10 may comprise processors, electronics devices, hardware devices, electronics components, logical circuits, memories, software codes, firmware codes, etc., or any combination thereof.

Figure 11:
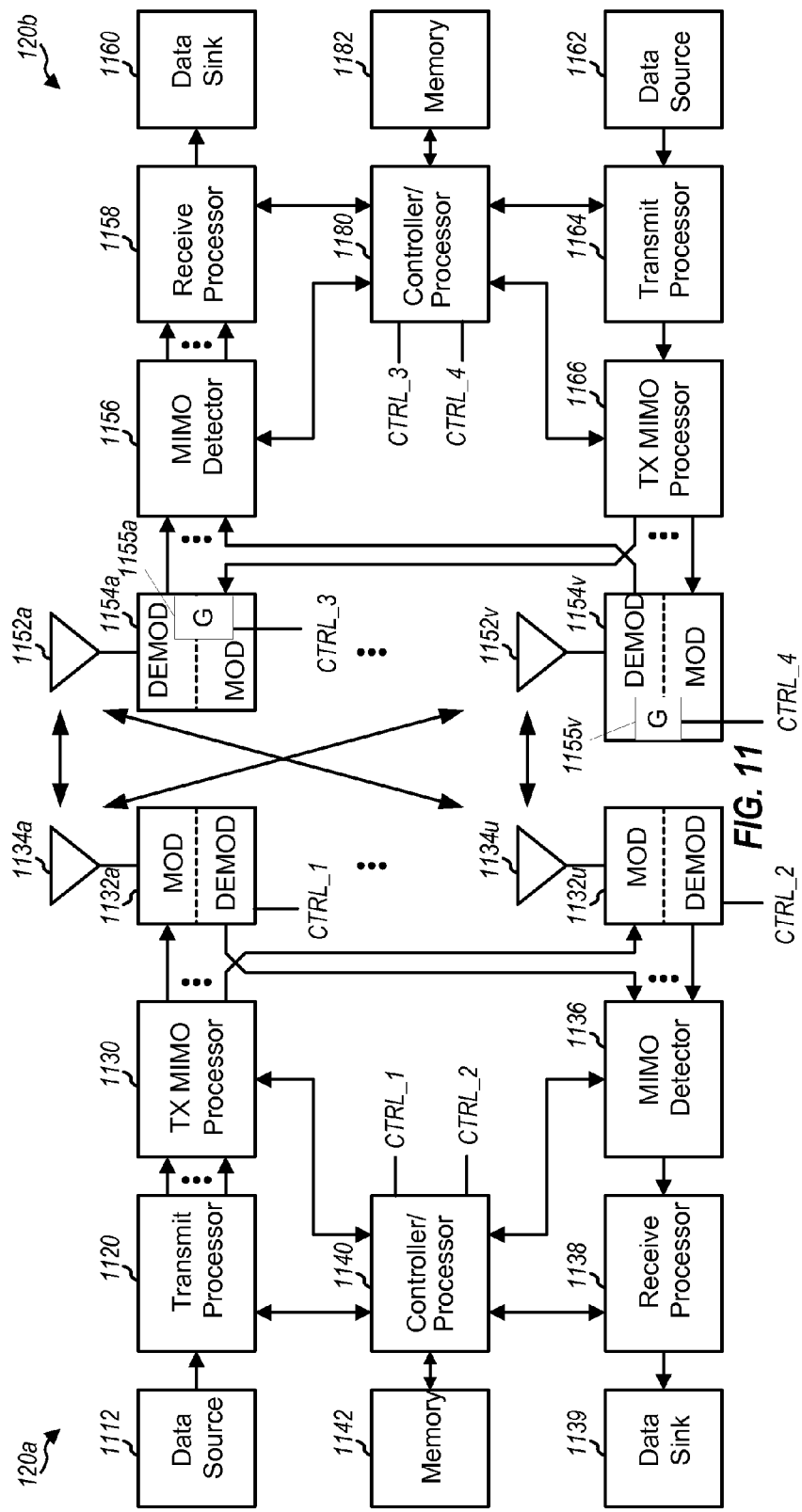
FIG. 11 shows a block diagram of two terminals.

FIG. 11 shows a block diagram of a design of terminals 120a and 120b, which are two terminals in wireless network 100 in FIG. 1. In this design, terminal 120a is equipped with U antennas 1134a through 1134u, and terminal 120b is equipped with V antennas 1152a through 1152v, where in general $U \geq 1$ and $V \geq 1$.

At terminal 120a, a transmit processor 1120 may receive data from a data source 1112 and control information from a controller/processor 1140. The control information may comprise information to send in a peer discovery signal, information to send in a paging signal, etc. Transmit processor 1120 may process (e.g., encode, interleave, and modulate) the data and control information and provide data symbols and control symbols, respectively. A transmit (TX) multiple-input multiple-output (MIMO) processor 1130 may perform spatial processing (e.g., precoding) on the data symbols, the control symbols, and/or pilot symbols, if applicable, and may provide U output symbol streams to U modulators (MODs) 1132a through 1132u. Each modulator 1132 may process a respective output symbol stream (e.g., for OFDM, SC-FDM, etc.) to obtain an output sample stream. Each modulator 1132 may further process (e.g., convert to analog, amplify, filter, and upconvert) the output sample stream to obtain a radio frequency (RF) signal. U RF signals from modulators 1132a through 1132u may be transmitted via U antennas 1134a through 1134u, respectively. Control line CTRL_1 couples the Controller/Processor 1140 to MOD/DEMOD element 1132a while control line CTRL_2 couples the Controller/Processor 1140 to MOD/DEMOD element 1132u. Accordingly, elements 1132a and 1132u can communicate with the Controller/Processor 1140 and the Controller/Processor 1140 can control the gain of elements 1132a and 1132u applied as part of the amplification performed by these elements.

At terminal 120b, antennas 1152a through 1152v may receive the RF signals from terminal 120a and may provide received signals to demodulators (DEMODs) 1154a through 1154v, respectively. Each demodulator 1154 may condition (e.g., filter, amplify, downconvert, and digitize) a respective received signal to obtain received samples. Each demodulator 1154 may further process the received samples (e.g., for OFDM, SC-FDM, etc.) to obtain received symbols. A MIMO detector 1156 may obtain received symbols from all V demodulators 1154a through 1154v, perform MIMO detection on the received symbols if applicable, and provide detected symbols. A receive processor 1158 may process (e.g., demodulate, deinterleave, and decode) the detected symbols, provide decoded data to a data sink 1160, and provide decoded control information to a controller/processor 1180. Control line CTRL_3 couples the Controller/Processor 1180 to MOD/DEMOD element 1154a while control line CTRL_2 couples the Controller/Processor 1180 to MOD/DEMOD element 1154v. Accordingly, elements 1154a and 1154v can communicate with the Controller/Processor 1180 and the Controller/Processor can control the gain of the demodulator elements 1154a and 1154v applied to received signals as part of the amplification performed by these elements. The demodulator elements 1154a and 1154v each include a controllable gain element G 1155a, 1155v. The controllable gain elements G 1155a, 1155v may be a controllable amplifiers which can be controlled by the Controller/Processor 1180. The controllable gain elements 1155a, 1155v under control of the Controller/Processor 1180 operate as automatic gain control elements.

At terminal 120b, data from a data source 1162 and control information from controller/processor 1180 may be processed by a transmit processor 1164, precoded by a TX MIMO processor 1166 if applicable, further processed by modulators 1154, and transmitted via antennas 1152. At terminal 120a, the RF signals from terminal 120b may be received by antennas 1134, processed by demodulators 1132, detected by a MIMO detector 1136 if applicable, and further processed by a receive processor 1138 to obtain the decoded data and control information transmitted by terminal 120b.

Each terminal 120 may generate and transmit a peer discovery signal, a paging signal, and/or other signals, e.g., using transmit processor 1120, TX MIMO processor 1130, and modulators 1132 at terminal 120a. Each terminal 120 may also receive peer discovery signals, paging signals, and/or other signals from other terminals, e.g., using demodulators 1154, MIMO detector 1156, and receive processor 1158 at terminal 120b. Each terminal 120 may also receive and process signals from base stations and/or other transmitter stations for communication, to obtain timing and/or broadcast information, etc. Each terminal 120 may determine receiver gain settings to use for different types of signals, as described above.

Controllers/processors 1140 and 1180 may direct the operation at terminals 120a and 120b, respectively. The processors and/or modules at each terminal may perform or direct process 700 in FIG. 7, process 900 in FIG. 9, and/or other processes for the techniques described herein. Memories 1142 and 1182 may store data and program codes for terminals 120a and 120b, respectively.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for wireless communication, comprising:
    determining receiver gain settings to be used during at least some different slots of a peer discovery time interval based on a received power of discovery signals received from different peer wireless communications terminals, the gain setting to be used during a particular individual slot of said at least some different slots being based on which peer device is expected to transmit in the particular individual slot and the received signal power of a peer discovery signal previously received from the peer wireless communications terminal expected to transmit in the particular individual slot;
    using the determined receiver gain settings to receive signals of a first signal type in said peer discovery time interval;
    determining a second receiver gain setting for a second signal type; and
    using the second receiver gain setting to receive signals of the second signal type in a second time interval.

2. The method of claim 1, wherein the signals of the first signal type are peer discovery signals and wherein the signals of the second signal type are paging signals.

3. The method of claim 2, further comprising:
    prior to using the determined receiver gain settings to receive signals of the first signal type, determining the slots in which different peer wireless communications terminals, from which peer discovery signals have been received, will transmit during said peer discovery interval.

4. The method of claim 1, wherein the determining the receiver gain settings comprises:
    measuring received power levels of the signals of the first signal type in at least one prior time interval, and
    determining the receiver gain settings based on the measured received power levels and a target power level for the signals of the first signal type.

5. The method of claim 1, further comprising:
    measuring total received power for the signals of the first signal type during the peer discovery time interval; and
    adjusting receiver gains during the peer discovery time interval based on the total received power for the signals of the first signal type.

6. The method of claim 1, wherein the determining the second receiver gain setting comprises selecting different receiver gain settings in different time intervals for the second signal type based on a predetermined pattern comprising multiple receiver gain settings.

7. The method of claim 1, further comprising:
    determining the second time interval for the second signal type based on a current time and a second periodic pattern for the second signal type.

8. The method of claim 1, further comprising:
    determining a third receiver gain setting for a third signal type; and
    using the third receiver gain setting to receive signals of the third signal type in a third time interval.

9. The method of claim 8, further comprising:
    obtaining timing information from the signals of the third signal type; and
    determining the second time interval for the second signal type based on the timing information.

10. An apparatus for wireless communication, comprising:
    at least one processor configured to:
        determine receiver gain settings to be used during at least some different slots of a peer discovery time interval based on a received power of discovery signals received from different peer wireless communications terminals, the gain setting to be used during a particular individual slot of said at least some different slots being based on which peer device is expected to transmit in the particular individual slot and the received signal power of a peer discovery signal previously received from the peer wireless communications terminal expected to transmit in the particular individual slot;
use the determined receiver gain settings to receive signals of a first signal type in said peer discovery time interval;
determine a second receiver gain setting for a second signal type; and
use the second receiver gain setting to receive signals of the second signal type in a second time interval.

11. The apparatus of claim 10, wherein the signals of the first signal type are peer discovery signals and the signals of the second signal type are paging signals.

12. The apparatus of claim 10, wherein the at least one processor is configured to:
measure received power levels of the signals of the first signal type in at least one prior time interval; and
determine the receiver gain settings based on the measured received power levels and a target power level for the signals of the first signal type.

13. The apparatus of claim 10, wherein the at least one processor is configured to select different receiver gain settings in different time intervals for the second signal type based on a predetermined pattern comprising multiple receiver gain settings.

14. The method of claim 1,
wherein said second signal type is a paging signal types;
wherein determining a second receiver gain setting for a second signal type includes determining said second receive gain based on a pattern of receiver gain setting sued in different paging time intervals; and
determining a third receiver gain setting to receive signals of the second signal type in a third time interval based on said pattern of receiver gain settings, said third time interval being another paging time interval, said third receiver gain setting being different from said second receiver gain setting.

15. A computer program product for use in a wireless communication device, the computer program product comprising:
a non-transitory computer readable medium comprising:
code for causing at least one computer to determine receiver gain settings to be used during at least some different slots of a peer discovery time interval based on a received power of discovery signals received from different peer wireless communications terminals, the gain setting to be used during a particular individual slot of said at least some different slots being based on which peer device is expected to transmit in the particular individual slot and the received signal power of a peer discovery signal previously received from the peer wireless communications terminal expected to transmit in the particular individual slot;
code for causing said at least one computer to use the determined receiver gain settings to receive signals of a first signal type in said peer discovery time interval;
code for causing said at least one computer to determine a second receiver gain setting for a second signal type; and
code for causing said at least one computer to use the second receiver gain setting to receive signals of the second signal type in a second time interval.

16. A wireless communication device, comprising:
means for determining receiver gain settings to be used during at least some different slots of a peer discovery time interval based on a received power of discovery signals received from different peer wireless communications terminals, the gain setting to be used during a particular individual slot of said at least some different slots being based on which peer device is expected to transmit in the particular individual slot and the received signal power of a peer discovery signal previously received from the peer wireless communications terminal expected to transmit in the particular individual slot;
means for using the determined receiver gain settings to receive signals of a first signal in said peer discovery time interval;
means for determining a second receiver gain setting for a second signal type; and
means for using the second receiver gain setting to receive signals of the second signal type in a second time interval.

17. The wireless communications device of claim 16, wherein the signals of the first signal type are peer discovery signals and wherein the signals of the second signal type are paging signals.

* * * * *